United States Patent
Okura et al.

(10) Patent No.: US 9,124,834 B2
(45) Date of Patent: Sep. 1, 2015

(54) SOLID-STATE IMAGE SENSING DEVICE HAVING SIGNAL HOLDING CIRCUITS FOR HOLDING IMAGE DIGITAL SIGNALS CONVERTED BY ANALOG-DIGITAL CONVERTERS

(75) Inventors: Shunsuke Okura, Kanagawa (JP); Mitsuo Magane, Kanagawa (JP)

(73) Assignee: RENESAS ELECTRONICS CORPORATION, Kawasaki-Shi, Kanagawa (JP)

(*) Notice: Subject to any disclaimer, the term of this patent is extended or adjusted under 35 U.S.C. 154(b) by 327 days.

(21) Appl. No.: 13/553,550

(22) Filed: Jul. 19, 2012

(65) Prior Publication Data
US 2013/0020469 A1 Jan. 24, 2013

(30) Foreign Application Priority Data
Jul. 22, 2011 (JP) ................................ 2011-161079

(51) Int. Cl.
*H04N 5/374* (2011.01)
*H03M 1/00* (2006.01)
*G02F 7/00* (2006.01)

(52) U.S. Cl.
CPC ............... *H04N 5/3742* (2013.01); *H03M 1/00* (2013.01); *G02F 7/00* (2013.01); *H03M 2201/4185* (2013.01)

(58) Field of Classification Search
USPC ................... 250/214 A, 214.1, 208.1, 214 R; 257/431; 348/303, 304, 312; 341/111
See application file for complete search history.

(56) References Cited

U.S. PATENT DOCUMENTS

| | | | |
|---|---|---|---|
| 6,646,583 B1 * | 11/2003 | Fossum et al. | ................ 341/144 |
| 6,879,278 B2 | 4/2005 | Watanabe et al. | |
| 8,411,186 B2 | 4/2013 | Iwasa | |
| 2003/0011829 A1 | 1/2003 | Dierickx | |
| 2006/0050162 A1 * | 3/2006 | Nakamura | .................... 348/308 |
| 2008/0258042 A1 * | 10/2008 | Krymski | .................... 250/208.1 |

FOREIGN PATENT DOCUMENTS

| | | |
|---|---|---|
| JP | 09-130248 A | 5/1997 |
| JP | 09-149321 A | 6/1997 |
| JP | 2000-152082 | 5/2000 |
| JP | 2004-357030 A | 12/2004 |
| JP | 2009-130799 A | 6/2009 |
| JP | 2011-78049 A | 4/2011 |

OTHER PUBLICATIONS

Japanese Office Action dated Jan. 20, 2015, issued in corresponding Japanese Patent Application No. 2011-161079; 10 pages with English translation.

* cited by examiner

*Primary Examiner* — Frances M Legasse, Jr.
(74) *Attorney, Agent, or Firm* — McDermott Will & Emery LLP

(57) ABSTRACT

A solid-state image sensing device according to the invention which can reduce an instantaneous current occurring in transferring image digital signals from analog-digital converters to registers to reduce noise sneaking into the analog-digital converters and a pixel array includes a pixel array, a vertical scanning circuit, a plurality of column ADCs, a plurality of registers, and control signal generation units. The control signal generation units are provided for respective groups into which the column ADCs and the registers disposed on one side of the pixel array are divided, and generate control signals of different timings, for respective units including at least one group, of transfer of converted image digital signals to the registers from the column ADCs operating in parallel.

4 Claims, 15 Drawing Sheets

SOLID-STATE IMAGE SENSING DEVICE HAVING SIGNAL HOLDING CIRCUITS FOR HOLDING IMAGE DIGITAL SIGNALS CONVERTED BY ANALOG-DIGITAL CONVERTERS

CROSS-REFERENCE TO RELATED APPLICATIONS

The disclosure of Japanese Patent Application No. 2011-161079 filed on Jul. 22, 2011 including the specification, drawings and abstract is incorporated herein by reference in its entirety.

BACKGROUND

The present invention relates to a solid-state image sensing device, and in particular, relates to a solid-state image sensing device that transfers an image digital signal converted by an analog-digital converter from the analog-digital converter to a signal holding circuit.

In the past, film cameras have been in widespread use. However, with the development of digital processing technology in recent years, digital cameras have been replacing the film cameras. The digital cameras have been significantly improving image quality thereof, and the latest models of digital cameras have better image quality than the film cameras. A solid-state image sensor is a key device to improve the image quality of the digital camera.

The solid-state image sensor used in the digital camera is divided broadly into CCD (Charge Coupled Device) and CMOS (Complementary Metal Oxide Semiconductor) image sensors. Particularly, in terms of higher functionality in cameras, attention has been given to the CMOS image sensor which can easily mount peripheral circuits.

Further, the CMOS image sensor includes an analog image sensor which outputs image analog signals generated by photoelectric conversion of light received by imaging elements in a pixel array and a digital image sensor which outputs image digital signals into which image analog signals generated by photoelectric conversion are converted. Particularly, in terms of data processing speed, attention has been given to the digital CMOS image sensor which easily enables enhanced speed.

Specifically, due to the higher data processing speed, the digital CMOS image sensor enables not only moving image shooting but also various applications in combination with image processing. For example, the digital CMOS image sensor enables a camera to determine the moment when a tennis racket hits a ball and automatically trigger the shutter, or to determine the moment when a child crosses the finish line at an athletic meet and automatically trigger the shutter to shoot the face of the child. To perform such processing, in particular it is necessary to convert captured image analog signals into image digital signals at high speed and transfer the converted image digital signals to an image processing circuit at high speed.

However, in the CMOS image sensor, it is necessary to process massive data to convert the captured image analog signals into the image digital signals. For example, in the case where the CMOS image sensor having 10 million imaging elements (10 million pixels) shoots a moving image with a frame rate of 30 fps, if one analog-digital converter (ADC) is used for data processing, it is necessary to convert an image analog signal of one imaging element (one pixel) into an image digital signal of gradation and transfer the image digital signal to a register within 3 ns, which is difficult to achieve.

Accordingly, in an image sensor disclosed in Japanese Unexamined Patent Publication No. 2000-152082 (Patent Document 1), analog-digital converters are disposed in respective columns in a pixel array. For example, the CMOS image sensor having 10 million pixels is configured with 3900 pixels (3900 columns) in the horizontal direction and 2600 pixels (2600 rows) in the vertical direction, and analog-digital converters are disposed in the respective columns, thereby converting an image analog signal into an image digital signal and transferring the image digital signal to a register within 12.8 μm at maximum, which is feasible. Further, in the image sensor disclosed in Patent Document 1, the pixel array is divided into two groups, in each of which image analog signals are converted into image digital signals which are transferred to registers, thereby enabling faster data processing.

SUMMARY

In the CMOS image sensor, transfer processing for transferring the image digital signals converted by the analog-digital converters to the registers is started based on a transfer signal (TRF signal). For example, in the case of a 12-bit (4096 gradation) image digital signal per pixel, image digital signals of 3900 pixels in the horizontal direction, that is, 46800-bit image digital signals are transferred to the registers at a time. Assuming that an instantaneous current of about 100 μA for transfer of 1-bit data to the register occurs in the CMOS image sensor, an instantaneous current of 46800×100 μA=4.68 A occurs in the CMOS image sensor on the rising edge of the transfer signal. In general, a power supply circuit for supplying power to the CMOS image sensor cannot feed a huge instantaneous current of about 4.68 A; therefore, a power supply voltage drops, which disadvantageously increases noise sneaking into the analog-digital converters and the pixel array.

Further, in the image sensor disclosed in Patent Document 1, the pixel array is divided into the two groups, in each of which the image analog signals are converted into the image digital signals which are transferred to the registers, which increases the conversions of the image analog signals into the image digital signals and the transfers from the analog-digital converters to the registers, and accordingly increases the instantaneous current occurring in transferring the image digital signals to the registers, which disadvantageously increases the noise sneaking into the analog-digital converters and the pixel array.

Accordingly, it is an object of the present invention to provide a solid-state image sensing device that can reduce an instantaneous current occurring in transferring image digital signals from analog-digital converters to registers (signal holding circuits) to reduce noise sneaking into the analog-digital converters and a pixel array.

To address the above problems, a solid-state image sensing device according to the invention includes a pixel array having a plurality of imaging elements arranged in a matrix, a row selection circuit for selecting a row in the pixel array, a plurality of analog-digital converters which are disposed in respective columns in the pixel array and convert image analog signals read out from imaging elements selected by the row selection circuit into image digital signals, a plurality of signal holding circuits for holding the image digital signals converted by the analog-digital converters in respective columns in the pixel array, and control signal generation units for generating control signals for controlling timings of transfer of the converted image digital signals from the analog-digital converters to the signal holding circuits. The control signal generation units are provided for respective groups into which the analog-digital converters and the signal holding circuits disposed on one side of the pixel array are divided, and generate the control signals of different timings, for respective units including at least one group, of transfer of the converted image digital signals to the signal holding circuits from the analog-digital converters operating in parallel.

Since the control signal generation units generate the control signals of different timings, for respective units including at least one group, of transfer of the converted image digital signals to the signal holding circuits from the analog-digital converters operating in parallel, the solid-state image sensing device according to the invention can reduce processing for transferring the image digital signals from the analog-digital converters to the signal holding circuits at the same timing and thereby reduce the instantaneous current occurring in transfer to reduce the noise sneaking into the analog-digital converters and the pixel array.

DETAILED DESCRIPTION

Before describing the details of a solid-state image sensing device according to embodiments of the present invention, background techniques thereof will be described.

Figure 1:
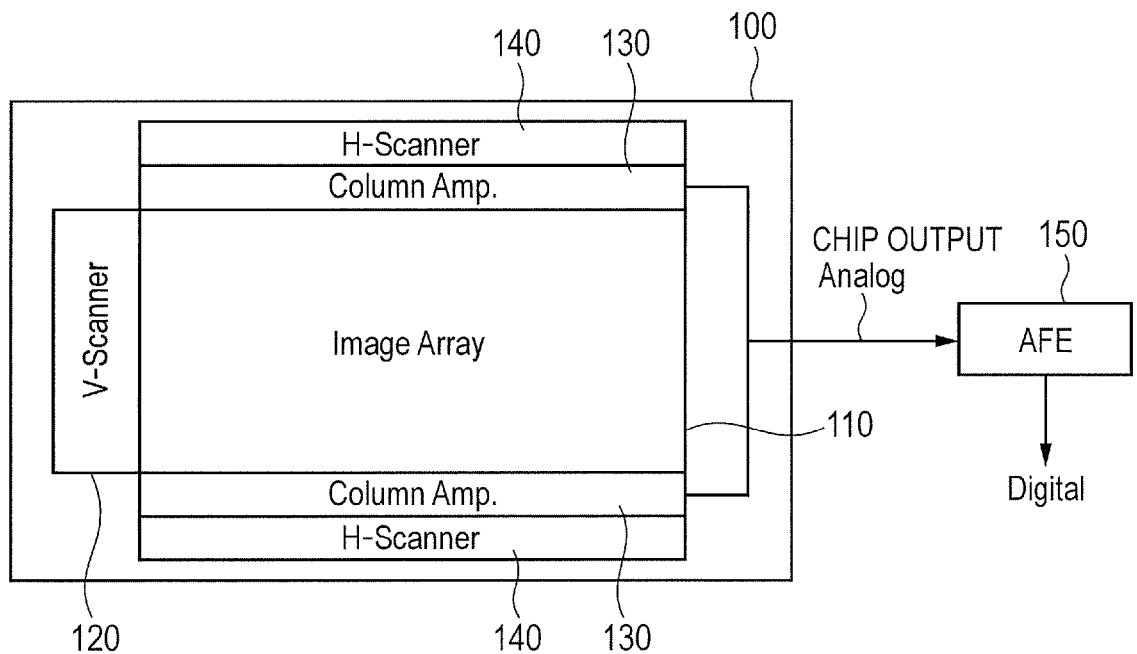
FIG. 1 is a schematic diagram showing the configuration of an analog CMOS image sensor.

FIG. 1 is a schematic diagram showing the configuration of an analog CMOS image sensor. The analog CMOS image sensor 100 shown in FIG. 1 includes a pixel array (image array) 110 having a plurality of imaging elements (pixels) arranged in a matrix, a vertical scanning circuit (V-scanner) 120 for scanning pixels in the vertical direction (column direction), column amplifiers 130 disposed in respective columns, and a horizontal scanning circuit (H-scanner) 140 for scanning pixels in the horizontal direction (row direction).

The column amplifiers 130 amplify image analog signals of pixels scanned and sent sequentially by the vertical scanning circuit 120. The image analog signals amplified by the column amplifiers 130 are scanned and outputted by the horizontal scanning circuit 140 to an AFE (Analog Front End) 150 disposed outside a chip. The AFE 150 converts the image analog signals outputted from the CMOS image sensor 100 into image digital signals, and outputs the image digital signals.

Thus, the off-chip AFE 150 converts the image analog signals of all pixels into the image digital signals; therefore, the analog CMOS image sensor 100 has an advantage that the converted image digital signals have uniform characteristics. On the other hand, there is a limit to the rate of transfer of the image analog signals from the CMOS image sensor 100 to the AFE 150; therefore, the analog CMOS image sensor 100 is unsuitable to process moving images or the like with high frame rates. Further, the analog CMOS image sensor 100 has a disadvantage that it is necessary to design the AFE 150 separately.

Figure 2:
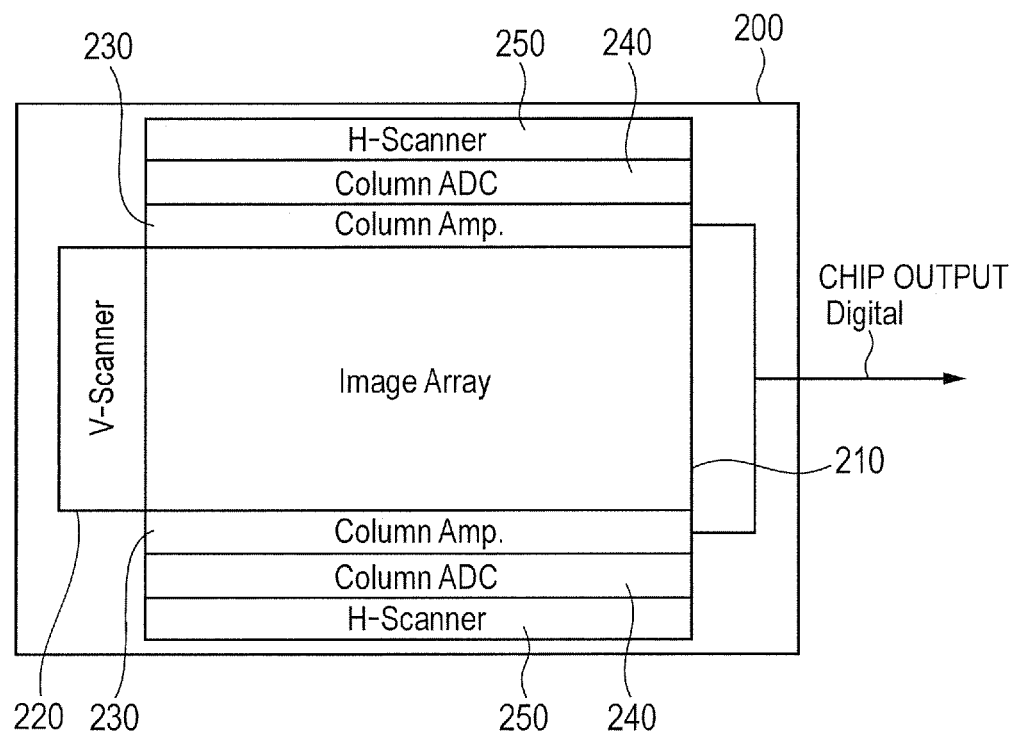
FIG. 2 is a schematic diagram showing the configuration of a digital CMOS image sensor.

FIG. 2 is a schematic diagram showing the configuration of a digital CMOS image sensor. The digital CMOS image sensor 200 shown in FIG. 2 includes a pixel array (image array) 210 having a plurality of imaging elements (pixels) arranged in a matrix, a vertical scanning circuit 220 for scanning pixels in the vertical direction (column direction), column amplifiers 230 disposed in respective columns, column ADCs (Column Analog Digital Converters) 240 for converting image analog signals outputted from the column amplifiers 230 into image digital signals, and a horizontal scanning circuit 250 for scanning pixels in the horizontal direction (row direction).

The column amplifiers 230 amplify image analog signals of pixels scanned and sent sequentially by the vertical scanning circuit 220, and output the amplified signals to the column ADCs 240. The column ADCs 240 convert the image analog signals amplified by the column amplifiers 230 into image digital signals. The image digital signals converted by the column ADCs 240 are scanned and outputted by the horizontal scanning circuit 250 to the outside of the chip.

Thus, the digital CMOS image sensor 200 uses the digital transfer by which the converted image digital signals are outputted outside the chip, and therefore can increase the transfer rate. Further, in the digital CMOS image sensor 200, since the converted image digital signals are outputted outside the chip, it is possible to utilize an existing data output I/F (Interface) such as LVDS (Low Voltage Differential Signaling). Further, each column ADC 240 is directly coupled to the corresponding column amplifier 230, which enables low-noise and high-precision design.

On the other hand, the digital CMOS image sensor 200 has a disadvantage of causing variation in the characteristics of the converted image digital signals because the respective column ADCs 240 disposed in the columns convert the image analog signals into the image digital signals. However, the digital CMOS image sensor 200 can digitally correct the image digital signals with linear FPN (Fixed Pattern Noise) correction.

Figure 3:
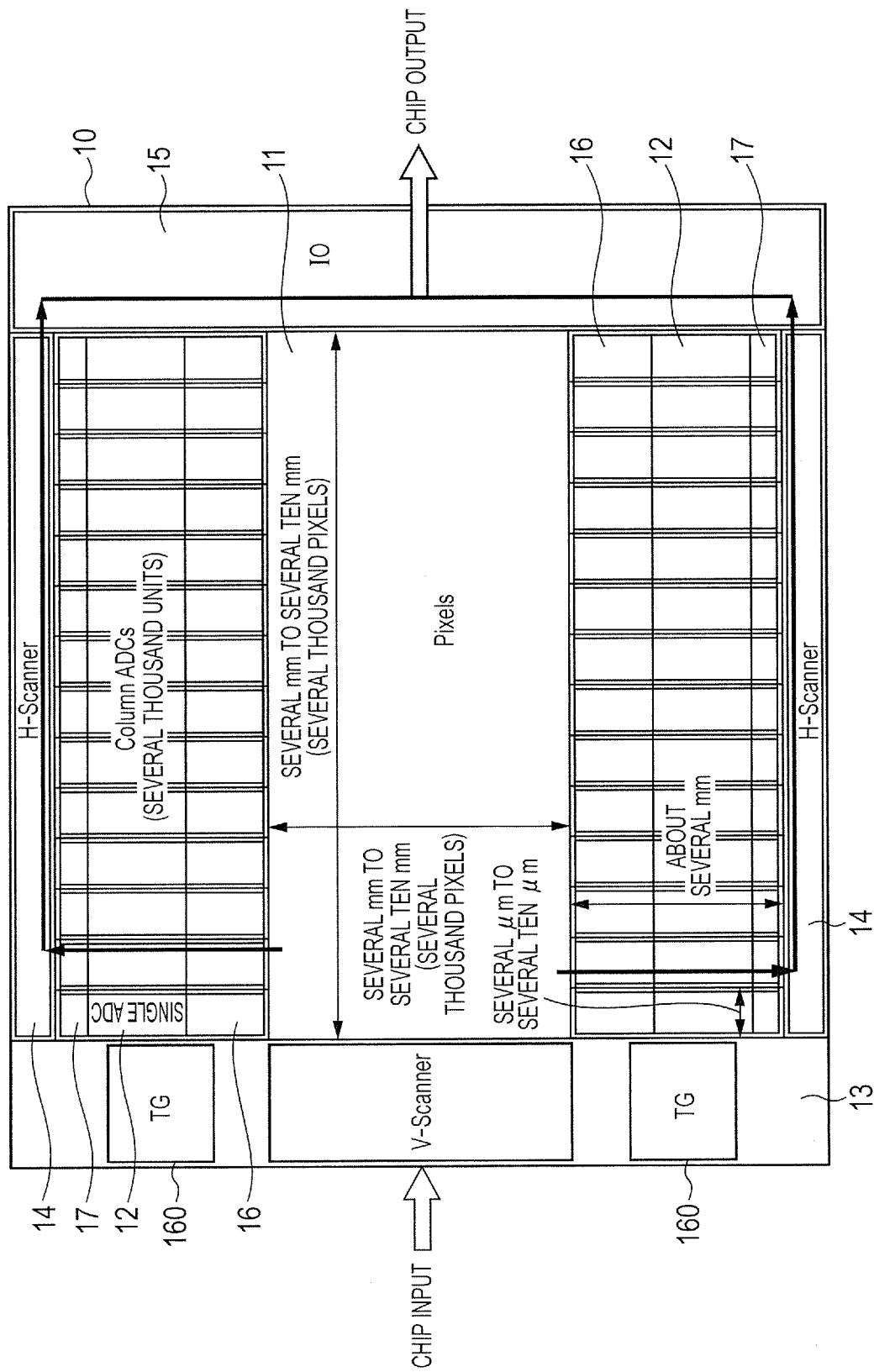
FIG. 3 is a layout diagram showing a layout example of units in a solid-state image sensing device.

A solid-state image sensing device according to embodiments of the present invention is a digital image sensor including column ADCs, and will be described below as a digital image sensor. FIG. 3 is a layout diagram showing a layout example of units in a solid-state image sensing device. The solid-state image sensing device 10 shown in FIG. 3 includes a pixel array 11, column ADCs 12 disposed in respective pixel columns, PGAs (Programmable Gain Amplifiers) 16, registers 17, a vertical scanning circuit (row selection circuit for selecting a row in the pixel array 11) 13, a horizontal scanning circuit 14, an IO (Input Output) unit 15, and a TG (Timing Generator) 160. Although not shown, the solid-state image sensing device 10 also includes a control circuit for controlling overall operation. The TG 160 generates a control signal for controlling the image sensor 200 and supplies the control signal to the image sensor 200.

For example, imaging elements (pixels) for several thousand pixels in the horizontal direction are disposed across a width of about several mm to several ten mm in the solid-state image sensing device 10. Further, imaging elements (pixels) for several thousand pixels in the vertical direction are disposed across a height of about several mm to several ten mm in the solid-state image sensing device 10.

The column ADCs 12 are disposed at the top and bottom of the pixel array 11 with a configuration in which one column ADC 12 is disposed across the width of two pixel columns. Therefore, column ADCs 12 in number corresponding to half the number of pixels in the horizontal direction are disposed at the top of the pixel array 11 and at the bottom as well. The PGAs 16 and the registers 17 are provided corresponding to the column ADCs 12; therefore, PGAs 16 and registers 17 in number corresponding to half the number of pixels in the horizontal direction are disposed at the top of the pixel array 11 and at the bottom as well. Further, a column ADC 12, a PGA 16, and a register 17 configure a column circuit.

The width of the column circuit is twice that of one pixel and is about several μm to several ten μm. Further, the total height of the column circuit is about several mm. Therefore, the column circuit has a very elongated shape. The column ADC 12, the PGA 16, and the register 17 have to be designed under the constraint of the elongated shape of the column circuit, and therefore need to be configured with small and simple circuits enabling low power consumption.

Figure 4:
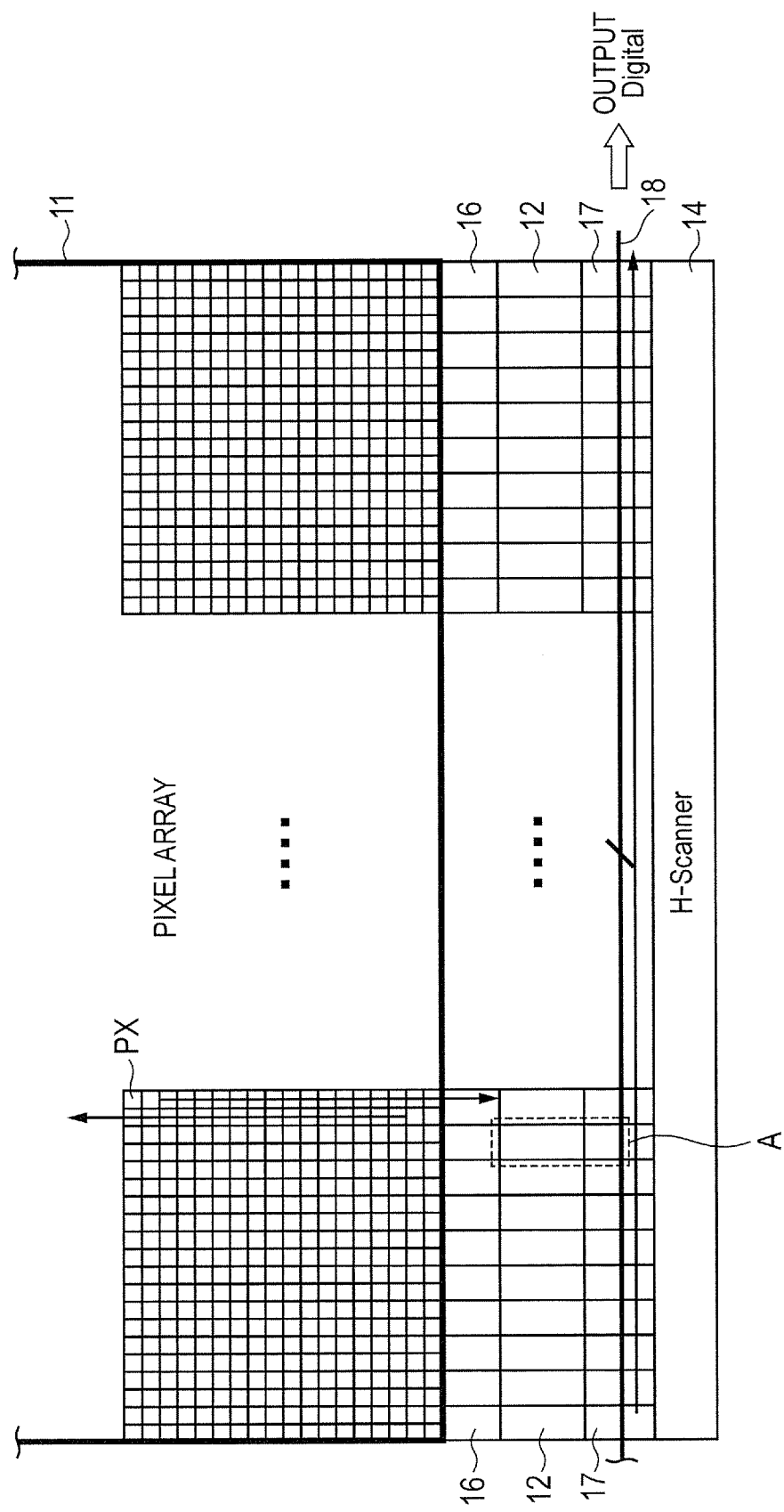
FIG. 4 is a schematic diagram enlarging the portion of a pixel array and column circuits in the solid-state image sensing device.

FIG. 4 is a schematic diagram enlarging the portion of the pixel array 11 and column circuits in the solid-state image sensing device 10. One column circuit is provided in two columns of pixels PX in the pixel array 11, and each column circuit includes the column ADC 12, the PGA 16, and the register 17.

The PGA 16 amplifies image analog signals of pixels sequentially sent from pixels PX of the column direction, and outputs the amplified signals to the column ADC 12. The column ADC 12 converts the image analog signals amplified by the PGA 16 into image digital signals, and outputs the image digital signals to the register 17. The register 17 is a signal holding circuit for holding the image digital signals converted by the column ADCs 12. The image digital signals held in the register 17 are sequentially read with a clock signal generated by the horizontal scanning circuit 14, and outputted outside the chip via an output bus 18 in units of 12 bits. Further, the same column circuits are disposed at the top of the pixel array 11, and with the same operation, the image digital signals held in the register 17 are outputted outside the chip.

Figure 5:
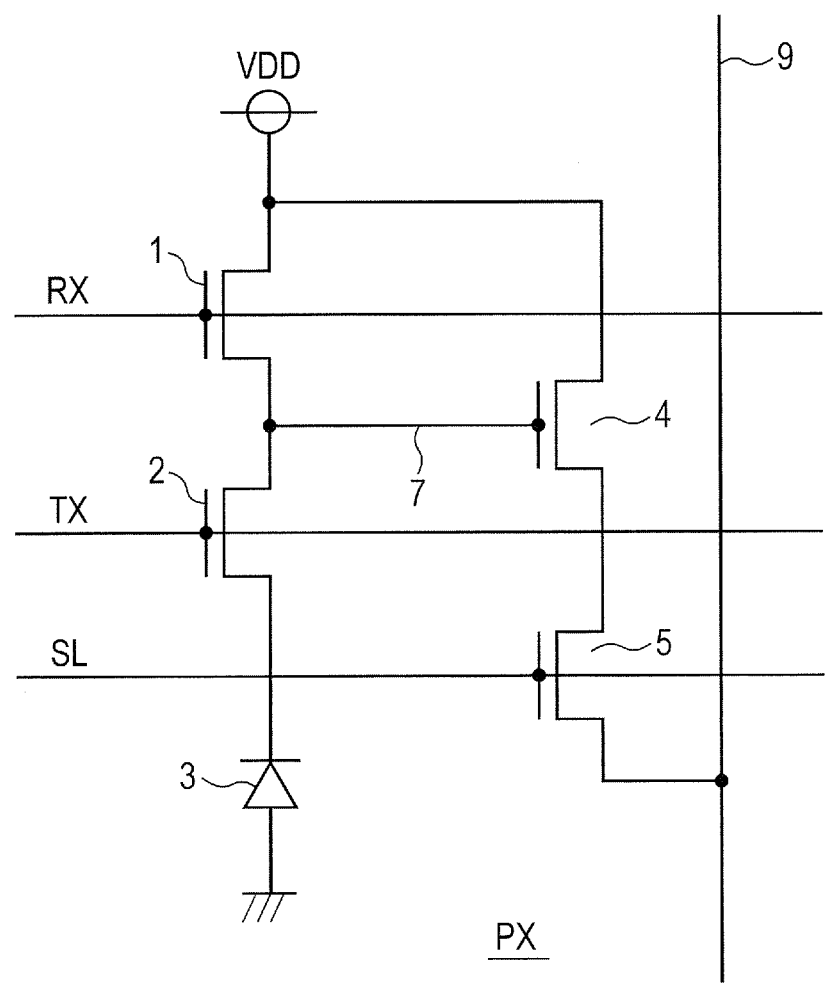
FIG. 5 is a circuit diagram showing an electrical equivalent circuit of a pixel PX.

FIG. 5 is a circuit diagram showing an electrical equivalent circuit of a pixel PX. The pixel PX includes a photodiode 3 for converting an optical signal into an electrical signal, a transfer transistor 2 for transferring the electrical signal generated by the photodiode 3 in accordance with a transfer control signal TX on a transfer control line, and a reset transistor 1 for resetting a floating diffusion 7 to a predetermined voltage level in accordance with a reset control signal RX on a reset control line.

Further, the pixel PX includes a source follower transistor 4 for outputting a potential according to a signal potential on the floating diffusion 7, and a row selection transistor 5 for transferring a signal transferred by the source follower transistor 4 to a vertical readout line 9 in accordance with a row selection signal SL on a row selection control line. The transistors 1, 2, 4, and 5 are configured with e.g. N-channel MOS transistors.

Hereinafter, the signal readout operation of the pixel PX shown in FIG. 5 will be described. First, the reset control signal RX is set to a high level (hereinafter abbreviated as H level) and the floating diffusion 7 is initialized, and then the reset control signal RX is set to a low level (hereinafter abbreviated as L level). With this operation, electric charge accumulated in the floating diffusion 7 by photoelectric conversion in the preceding cycle is initialized.

Next, the row selection signal SL becomes the H level, and a signal according to a potential on the floating diffusion 7 is transferred to the vertical readout line 9 through the source follower transistor 4. This signal is stored in a reference capacitive element included in a sampling circuit (CDS circuit) described later.

In a pixel readout period after the output, assume that electric charge is generated by light irradiation of the pixel PX and photoelectric conversion. Then, when the transfer control signal TX becomes the H level, the accumulated electric charge is transferred to the floating diffusion 7. Further, when the row selection signal SL becomes the H level, a signal according to a potential on the floating diffusion 7 is transferred to the vertical readout line 9, and a signal charge accumulation capacitive element included in the later-described sampling circuit (CDS circuit) is charged.

Next, read-out reference potential and signal potential are differentially amplified for the readout of the information of the pixel PX.

Sampling is performed twice for one pixel PX and the reference potential and the signal potential are compared, that is, the so-called correlated double sampling is performed, thereby canceling the influence of irregularity in the pixel PX to read out only the electrical signal generated by the photodiode 3.

After the completion of the information readout from the pixel PX, the row selection signal SL becomes the L level, and the row selection transistor 5 is turned off.

The pixels PX are arranged in a matrix, and the information of pixels of a row is read out in parallel.

Figure 6:
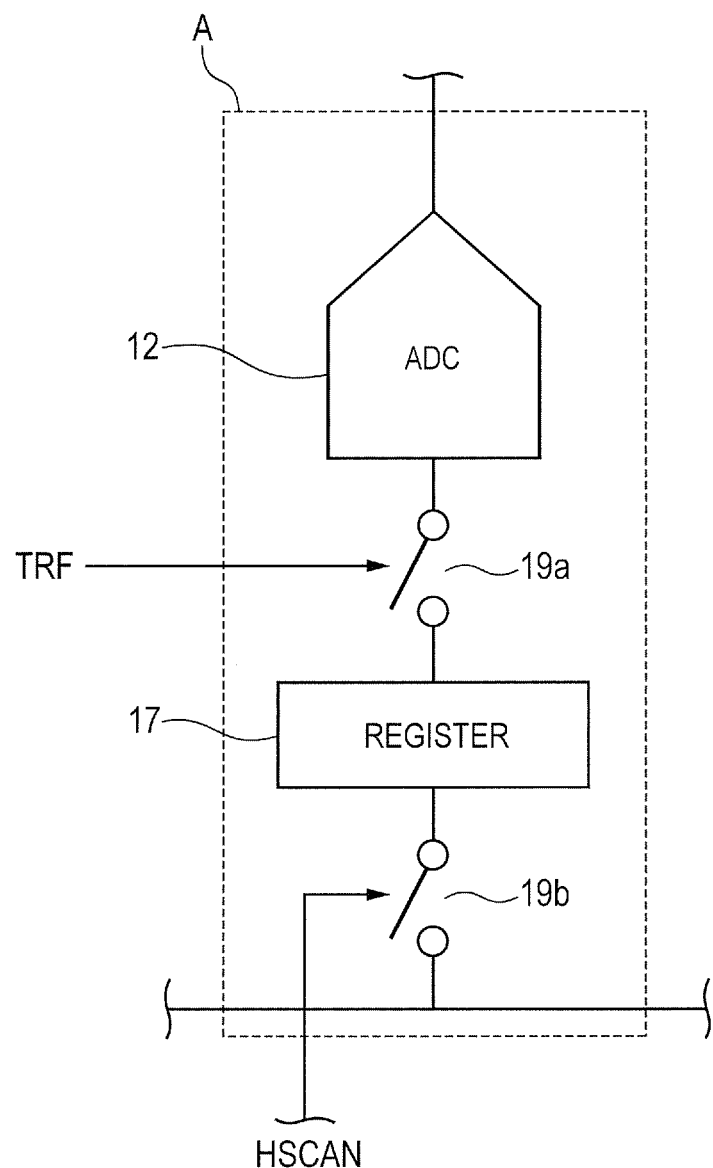
FIG. 6 is a schematic diagram showing the configuration of a column ADC and a register.

FIG. 6 is a schematic diagram showing the configuration of the column ADC 12 and the register 17. A circuit A including the column ADC 12 and the register 17 shown in FIG. 6 is a part of the column circuit shown in FIG. 4. Further, the circuit A includes a switching element 19a for switching the coupling between the column ADC 12 and the register 17 and a switching element 19b for switching the coupling between the register 17 and the output bus. The switching element 19a couples the column ADC 12 to the register 17 by a transfer signal TRF generated by the TG 160 and transfers the image digital signal converted by the column ADC 12 from the column ADC 12 to the register 17. The transfer signal TRF is a signal for starting processing for transferring the converted image digital signal from the column ADC 12 to the register 17, and particularly on the rising edge of the signal, transfers the converted image digital signal from the column ADC 12 to the register 17. The switching element 19b couples the register 17 to the output bus 18 by a clock signal HSCAN generated by the horizontal scanning circuit 14 and outputs the image digital signal held by the register 17 from the register 17 to the output bus 18.

Figure 7:
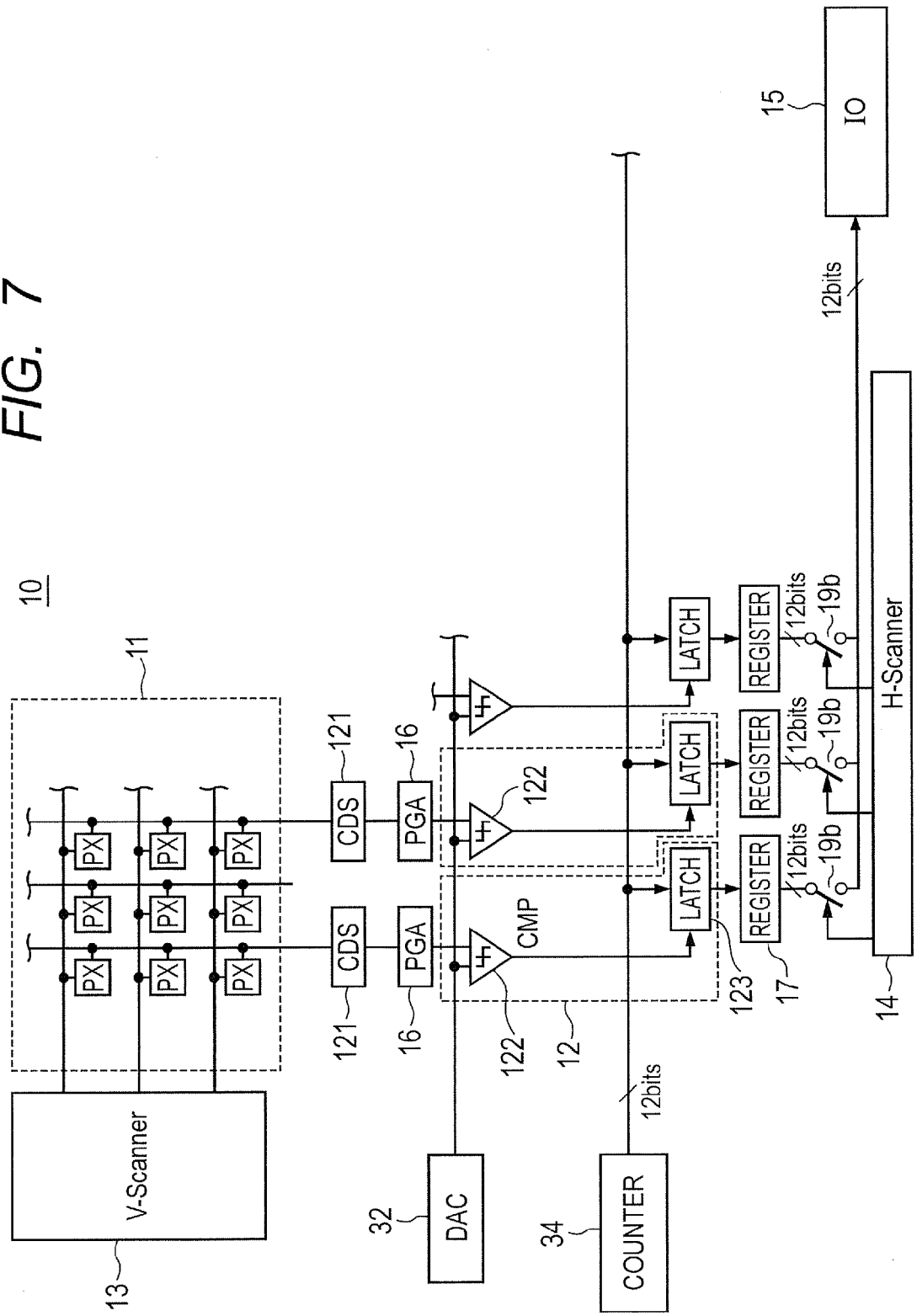
FIG. 7 is a block diagram of the solid-state image sensing device illustrating the configuration of the column ADC.

Next, the operation of the solid-state image sensing device 10 will be described with reference to a drawing showing a more detailed configuration of the column ADC 12. FIG. 7 is a block diagram of the solid-state image sensing device 10 illustrating the configuration of the column ADC 12. The column ADC 12 shown in FIG. 7 includes a comparator 122 and a latch circuit 123.

First, the solid-state image sensing device 10 shown in FIG. 7 selects a row in the pixel array 11 by scanning by the vertical scanning circuit 13, and outputs image analog signals of pixels PX in the selected row in the pixel array 11 to CDS circuits 121. The CDS circuit 121 performs correlated double sampling to cancel the influence of irregularity in the pixel PX, thereby reading out only the electrical signal generated by the photodiode 3.

Figure 8:
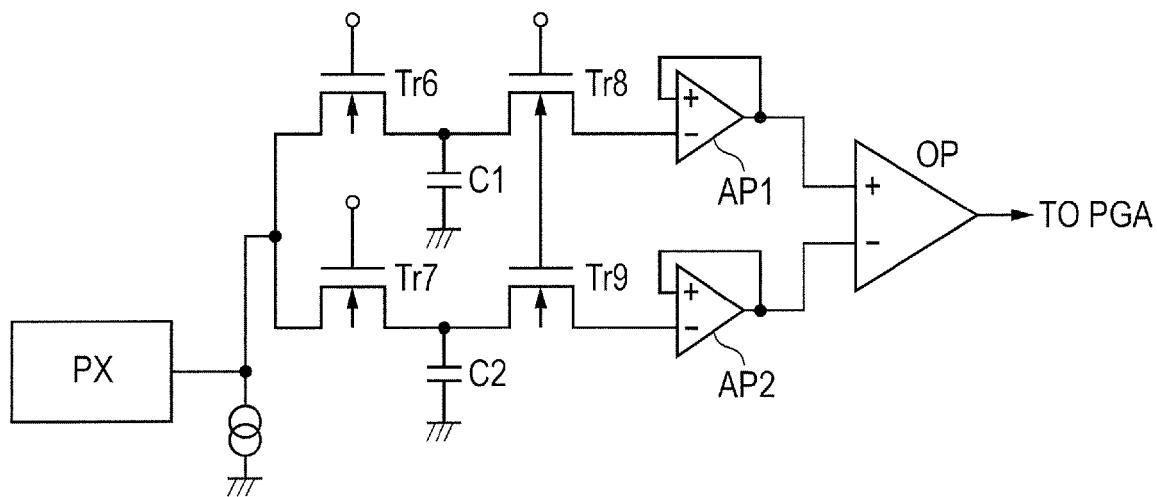
FIG. 8 is a circuit diagram showing an example of the circuit configuration of a CDS circuit.

FIG. 8 is a circuit diagram showing an example of the circuit configuration of the CDS circuit 121. The CDS circuit 121 shown in FIG. 8 includes MOS transistors (hereinafter simply referred to as transistors) Tr6 to Tr9, capacitors C1 and C2, amplifiers AP1 and AP2, and a differential operational amplifier (hereinafter referred to as an operational amplifier) OP. The gate of the transistor Tr6 is coupled to a first control signal line, and the gate of the transistor Tr7 is coupled to a second control signal line. The drain of the transistor Tr6 is coupled to the drain of the transistor Tr7, and the coupling point thereof is coupled to the pixel PX.

The source of the transistor Tr6 is coupled to the drain of the transistor Tr8, and the coupling point thereof is coupled to one end of the capacitor C1 (signal charge accumulation capacitive element) for sample holding. The other end of the capacitor C1 is coupled to a ground. Further, the source of the transistor Tr7 is coupled to the drain of the transistor Tr9, and the coupling point thereof is coupled to one end of the capacitor C2 (reference capacitive element) for sample holding. The other end of the capacitor C2 is coupled to the ground. The gate of the transistor Tr9 is coupled to the gate of the transistor Tr8, and coupled to a third control signal line.

The source of the transistor Tr8 is coupled through the amplifier AP1 to the positive input terminal of the operational amplifier OP, and the source of the transistor Tr9 is coupled through the amplifier AP2 to the negative input terminal of the operational amplifier OP.

At a time when information of the pixel PX is read out, the first control signal line becomes the H level, and the transistor Tr6 in the CDS circuit 121 goes into conduction. Thereby, the information (signal potential) read out from the pixel PX is held in the capacitor C1 for sample holding in the CDS circuit 121.

Next, at a time when the information of the pixel PX is reset, the second control signal line becomes the H level, and the transistor Tr7 in the CDS circuit 121 goes into conduction. Thereby, a voltage (reference potential) at the reset of the pixel PX is held in the capacitor C2 for sample holding in the CDS circuit 121. Then, when the third control signal line becomes the H level, the transistors Tr8 and Tr9 in the CDS circuit 121 go into conduction, and the operational amplifier OP performs an operation of the difference between the electric charge (signal potential) accumulated in the capacitor C1 and the electric charge (reference potential) accumulated in the capacitor C2. This difference corresponds to only the electrical signal generated by the photodiode 3, and the electrical signal is outputted to the PGA 16.

Thus, the CDS circuit 121 performs correlated double sampling based on the difference between the information of the pixel PX before the reset and the voltage of the pixel PX at the reset, and outputs the image signal without noise to the PGA 16.

Referring back to FIG. 7, the comparator 122 compares the image analog signal amplified by the PGA 16 with a stepwise ramp voltage Vramp generated by a DAC (Digital Analog Converter) 32. The comparator 122 outputs a trigger signal CMP at a time when the image analog signal and the ramp voltage Vramp match.

At a time of the trigger signal CMP outputted from the comparator 122, the latch circuit 123 holds a counter signal of a counter 34 whose counter value increments with the ramp voltage Vramp. In the column ADC 12, the counter signal held by the latch circuit 123 is the image digital signal into which the image analog signal of the pixel PX is converted.

Figure 9:
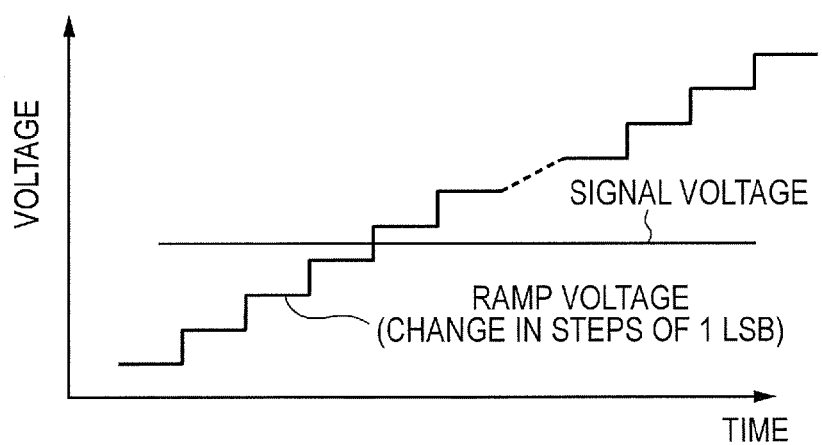
FIG. 9 is a diagram showing temporal changes of the signal voltage of an image analog signal and a ramp voltage Vramp.

The counter 34 starts counting in which the counter value returns to an initial counter value by a signal from the TG 160 and increments by the transfer control signal TX before starting processing for converting the image analog signal of the pixel PX into the digital signal. The ramp voltage Vramp also increases with the counter value in steps. FIG. 9 is a diagram showing temporal changes of the signal voltage of the image analog signal and the ramp voltage Vramp. As shown in FIG. 9, the ramp voltage Vramp increases in steps of 1 LSB (Least Significant Bit) from the minimum voltage. In this context, LSB signifies steps of processing for converting the analog signal into the digital signal. In the case of conversion into a 12-bit digital signal, LSB signifies 4096 (2 to the 12th power) steps. The ramp voltage Vramp may be decreased in steps of 1 LSB from the maximum voltage. As shown in FIG. 9, the comparator 122 outputs the trigger signal CMP at a time when the signal voltage of the image analog signal and the ramp voltage Vramp match.

The column ADC 12 is not limited to an integral ADC shown in FIG. 7, and may be a subrange ADC.

Figure 10:
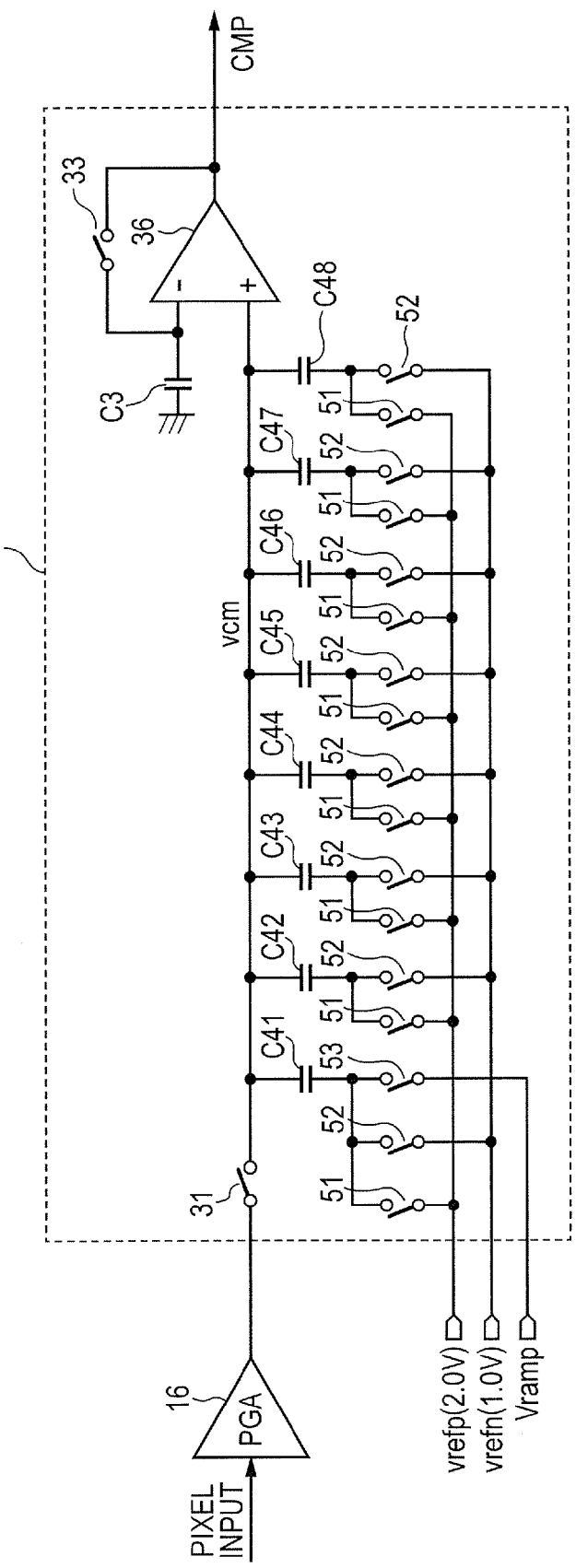
FIG. 10 is a circuit diagram showing the configuration of a subrange ADC.

FIG. 10 is a circuit diagram showing the configuration of a subrange ADC. The column ADC shown in FIG. 10 is an example of the subrange ADC using a charge comparison method. In the subrange ADC, the AD conversion stage is divided into two stages: coarse and fine stages. The AD conversion method is not limited to the charge comparison method as long as it has a conversion rate capable of real-time processing and can be formed within the constraint of the elongated shape shown in FIG. 3.

In FIG. 10, the subrange ADC includes a switch 31, a switch 33, a comparator 36, a capacitor C3, capacitors C41 to C48, and switches 51 to 53.

Next, the latch circuit 123 transfers the held image digital signal to the register 17. The register 17 holds the image digital signal transferred from the latch circuit 123, and outputs the held image digital signal through the output bus to the IO unit 15 by the clock signal HSCAN generated by the horizontal scanning circuit 14.

Figure 11:
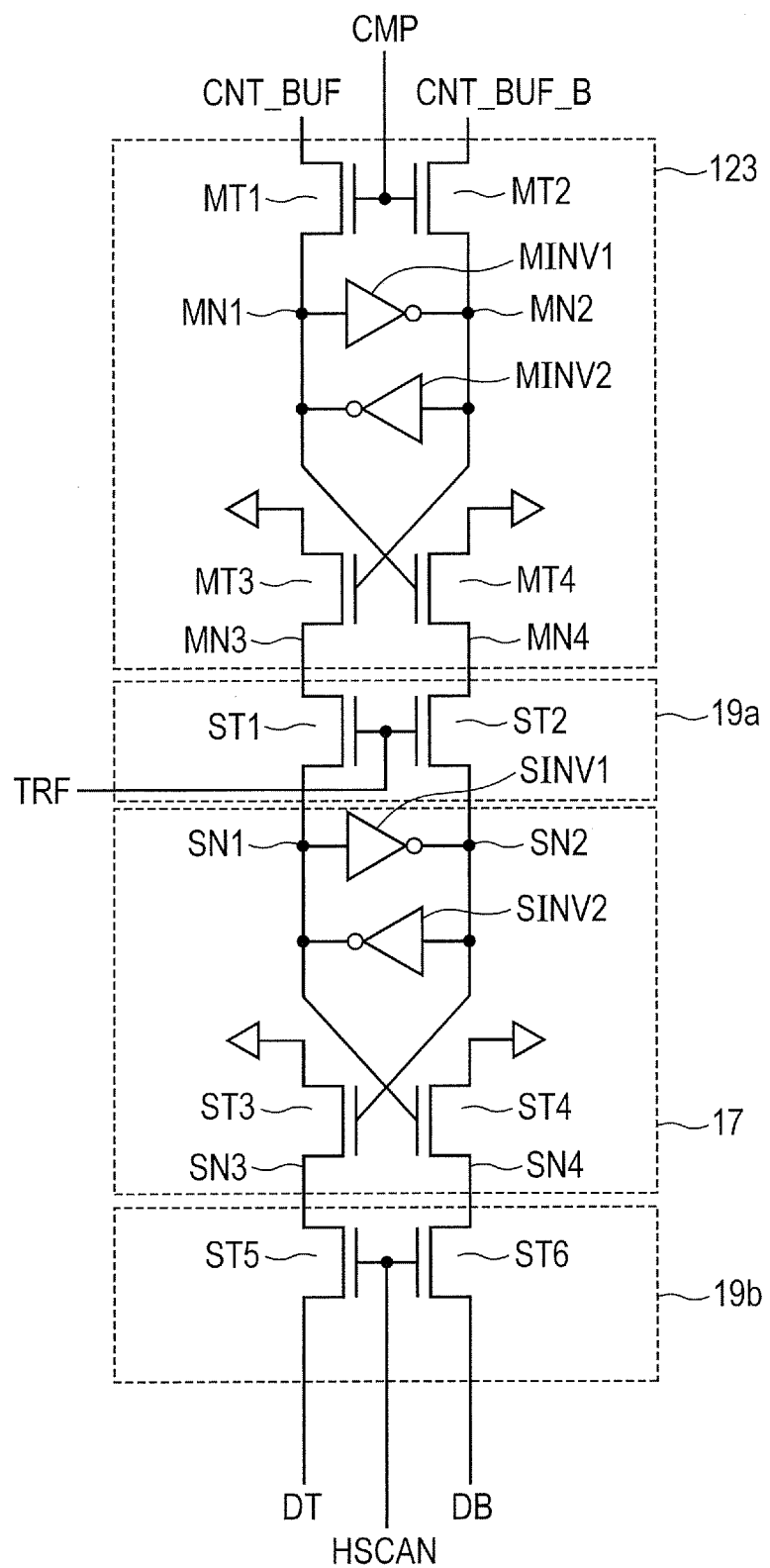
FIG. 11 is a circuit diagram showing the circuit configuration of a latch circuit and the register.

Here, the circuit configuration of the latch circuit 123 and the register 17 will be described. FIG. 11 is a circuit diagram showing the circuit configuration of the latch circuit 123 and the register 17. The circuit diagram shown in FIG. 11 includes the latch circuit 123, the register 17, and switching elements 19a and 19b.

The latch circuit 123 includes an NMOS transistor MT1 which receives the trigger signal CMP at its gate and receives a counter signal CNT_BUF at its drain, an NMOS transistor MT2 which receives the trigger signal CMP at its gate and receives an inversion signal CNT_BUF_B of the counter signal CNT_BUF at its drain, and inverters MINV1 and MINV2 configuring a holding circuit for holding data of the counter signal CNT_BUF and the inversion signal CNT_BUF_B of the counter signal CNT_BUF.

The latch circuit 123 further includes an NMOS transistor MT3 which receives an output signal of the inverter MINV1 at its gate and has its source coupled to a ground potential and an NMOS transistor MT4 which receives an output signal of the inverter MINV2 at its gate and has its source coupled to the ground potential.

In the latch circuit 123, the counter signal CNT_BUF and the inversion signal CNT_BUF_B are controlled by the trigger signal CMP; accordingly, the writing of data (image digital signal) continues during the H level of the trigger signal CMP, and the data (image digital signal) is held on the falling edge of the trigger signal CMP.

When the transfer signal TRF becomes the H level, NMOS transistors ST1 and ST2 of the switching element 19a are turned on, and the latch circuit 123 is coupled to the register 17, so that the data (image digital signal) held by the latch circuit 123 is transferred to the register 17. Since the register 17 has the same configuration as the latch circuit 123, description thereof is omitted.

The switching element 19b includes NMOS transistors ST5 and ST6 which receive the clock signal HSCAN generated by the horizontal scanning circuit 14 at their gates and have their drains respectively coupled to the output nodes of the data (image digital signal) held by the register 17. When the clock signal HSCAN becomes the H level, the data (image digital signal) held in the register 17 is outputted as signals DT and DB through the output bus to the IO unit 15.

First Embodiment

Next, a solid-state image sensing device 10 according to a first embodiment of the invention will be described. The solid-state image sensing device 10 according to the first embodiment of the invention has the same configuration as the foregoing solid-state image sensing device 10 except for the configuration of the column ADCs 12 and the registers 17; therefore, the same components are denoted by the same reference numerals, and detailed description thereof is omitted.

Figure 12:
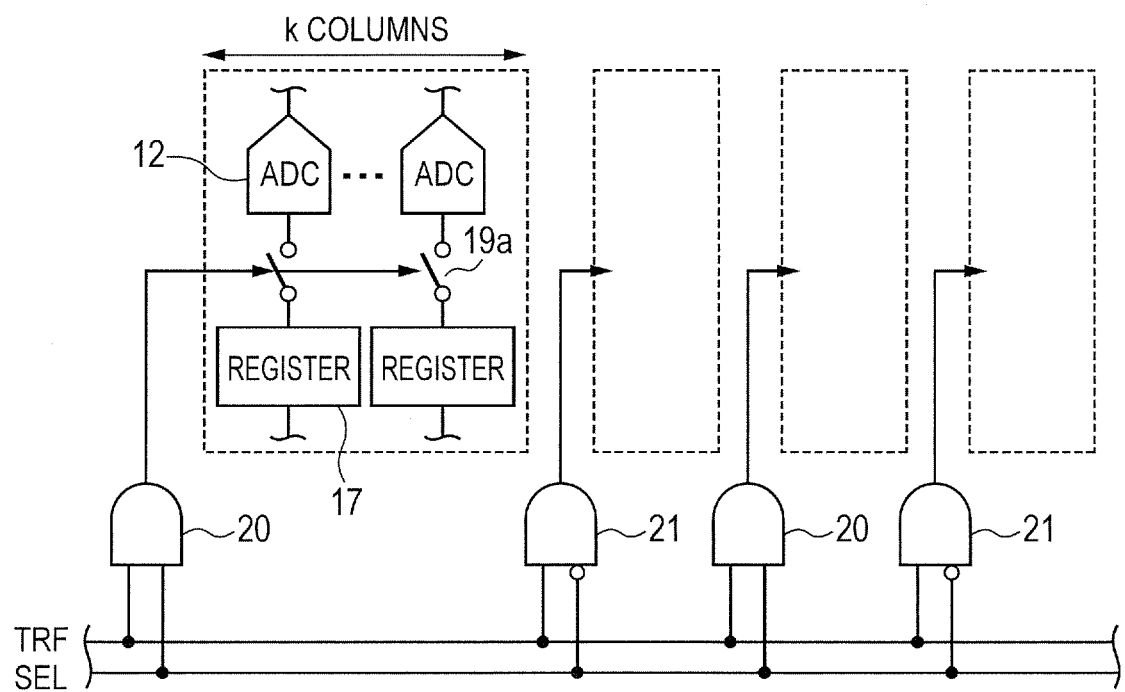
FIG. 12 is a schematic diagram showing the configuration of column ADCs and registers in a solid-state image sensing device according to a first embodiment of the invention.

FIG. 12 is a schematic diagram showing the configuration of the column ADCs 12 and the registers 17 in the solid-state image sensing device 10 according to the first embodiment of the invention. The column ADCs 12 and the registers 17 shown in FIG. 12 are divided into groups of k pixel columns (k is a natural number equal to or greater than 1), and provided with logic circuits 20 and 21 for generating control signals for controlling timings of transfer of converted image digital signals from the column ADCs 12 to the registers 17 for the respective divided groups. The logic circuits 20 and 21 function as control signal generation units for generating control signals for controlling timings of transfer to the registers 17 from the column ADCs 12 operating in parallel. Although the converted image digital signal is transferred from the latch circuit 123 in the column ADC 12 to the register 17 as described above, the following description is based on transfer from the column ADC 12 to the register 17 for simplicity.

The logic circuit 20 is an AND circuit, and generates a control signal having the H level by performing a logic operation when the inputted transfer signal TRF and selection signal SEL are both at the H level ("1" in expression by "0" and "1"). The logic circuit 21 is an AND circuit to which the level of the selection signal SEL is inversely inputted, and generates a control signal having the H level by performing a logic operation when the inputted transfer signal TRF is at the H level and the selection signal SEL is at the L level ("0" in expression by "0" and "1").

That is, with the 1-bit selection signal SEL, the solid-state image sensing device 10 switches between the logic circuits 20 and 21 for generating the control signals having the H level. Therefore, the timing when the control signal generated by the logic circuit 20 becomes the H level differs from the timing when the control signal generated by the logic circuit 21 becomes the H level, thus making different transfer timings of image digital signals between the groups provided with the logic circuits 20 and 21 respectively.

Figure 13:
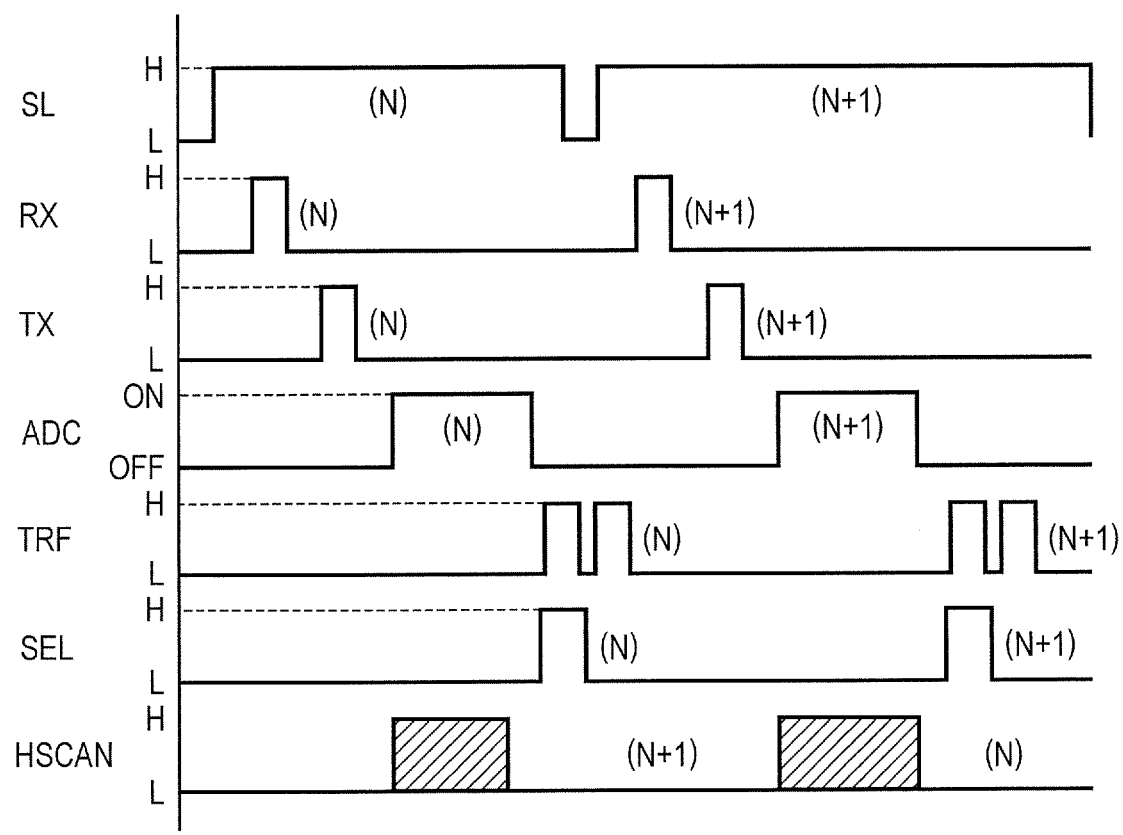
FIG. 13 is a timing chart of assistance in explaining the operation of the solid-state image sensing device according to the first embodiment of the invention.

FIG. 13 is a timing chart of assistance in explaining the operation of the solid-state image sensing device 10 according to the first embodiment of the invention. The timing chart of FIG. 13 illustrates signal waveforms of the row selection signal SL, the reset control signal RX, the transfer control signal TX, the state of the column ADC 12, the transfer signal TRF, the selection signal SEL, and the clock signal HSCAN in the readout of image digital signals from pixels in the Nth and (N+1)th rows.

As shown in FIG. 13, the vertical scanning circuit 13 outputs the row selection signal SL having the H level to select pixels in the Nth row. Then, the vertical scanning circuit 13 outputs the reset control signal RX having the H level to reset the pixels in the Nth row, and then outputs the transfer control signal TX to read out electric charge accumulated in the photodiode 3 as the image analog signal. The read image analog signal is converted into the image digital signal by the column ADC 12 in the on state.

The converted image digital signal is transferred from the column ADC 12 to the register 17 by the transfer signal TRF and the selection signal SEL. Specifically, in a period when the selection signal SEL is at the H level, on the rising edge of the transfer signal TRF from the L level to the H level, the control signal generated by the logic circuit 20 becomes the H level, so that in the group provided with the logic circuit 20, the converted image digital signal is transferred from the column ADC 12 to the register 17. Further, in a period when the selection signal SEL is at the L level, on the rising edge of the transfer signal TRF from the L level to the H level, the control signal generated by the logic circuit 21 becomes the H level, so that in the group provided with the logic circuit 21, the converted image digital signal is transferred from the column ADC 12 to the register 17. The period when the selection signal SEL is at the L level and the period when the reset control signal RX is at the H level partially overlap the period when the transfer signal TRF is at the H level.

The image digital signal transferred to the register 17 is outputted through the output bus to the IO unit 15 by the clock signal HSCAN while image analog signals of pixels in the (N+1)th row are being converted into image digital signals. Thus, since the timings of transfer of image digital signals in the Nth row from the column ADCs 12 to the registers 17 differ between the groups provided with the logic circuits 20 and 21 respectively, the image digital signals of 3000 pixels can be transferred from the column ADCs 12 to the registers 17 at two different timings. Accordingly, in comparison with transfer of the image digital signals of 3000 pixels from the column ADCs 12 to the registers 17 at the same timing, the solid-state image sensing device 10 can reduce by half an instantaneous current occurring in transfer and thereby reduce noise sneaking into the column ADCs 12 and the pixel array 11. During the H level of the transfer control signal TX, to reduce noise, the operation of peripheral clocks (transfer signal TRF, clock signal HSCAN, etc.) is not performed.

The logic circuits 20 and 21 shown in FIG. 12 are shared by the column ADCs 12 in k columns to reduce the instantaneous current occurring in the logic circuits and reduce the occupation area. The logic circuits 20 and 21 are not limited to the configuration shown in FIG. 12, and may have a NAND circuit to invert the selection signal SEL.

As described above, since the solid-state image sensing device 10 according to the first embodiment of the invention switches between the logic circuits 20 and 21 for generating the control signals of different transfer timings for the respective groups, the solid-state image sensing device 10 can reduce processing for transferring the image digital signals from the column ADCs 12 to the registers 17 at the same timing and thereby reduce the instantaneous current occurring in transfer to reduce the noise sneaking into the column ADCs 12 and the pixel array 11.

Further, the number of groups provided with the logic circuits 20 is not necessarily the same as the number of groups provided with the logic circuits 21. One group may be provided with the logic circuit 20, and the other groups may be provided with the logic circuits 21. Alternatively, one group may be provided with the logic circuit 21, and the other groups may be provided with the logic circuits 20.

Second Embodiment

The solid-state image sensing device 10 according to the first embodiment switches between the logic circuits 20 and 21 for generating the control signals having the H level, using the 1-bit selection signal SEL, thus generating the control signals of different transfer timings. In a second embodiment, a solid-state image sensing device for switching between logic circuits for generating control signals using a 2-bit selection signal SEL will be described.

Figure 14:
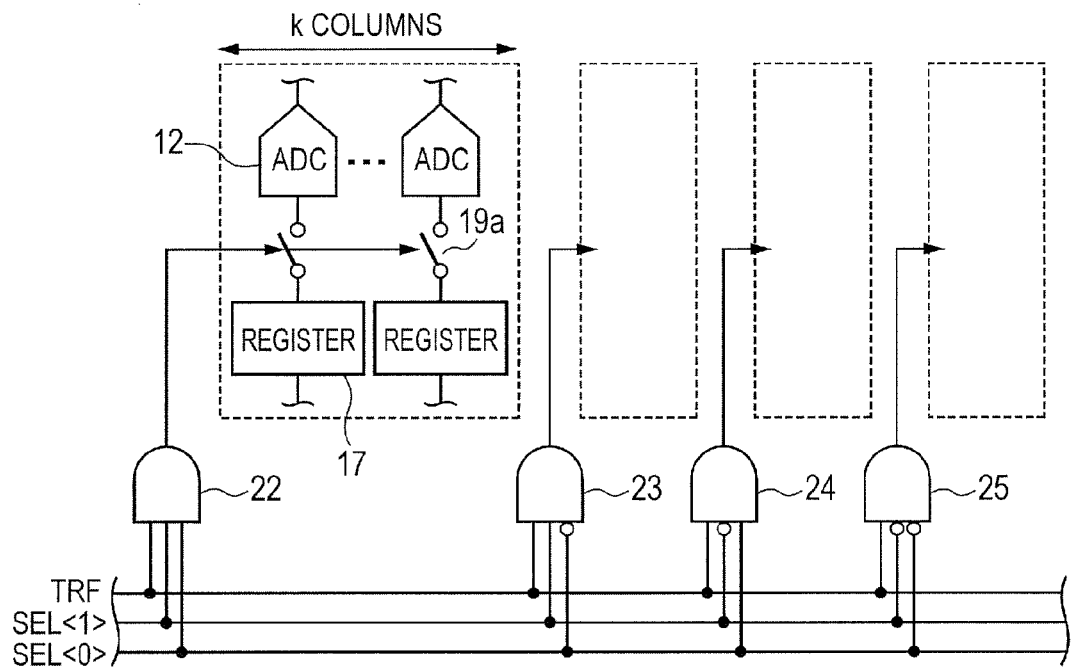
FIG. 14 is a schematic diagram showing the configuration of the column ADCs and the registers in a solid-state image sensing device according to a second embodiment of the invention.

FIG. 14 is a schematic diagram showing the configuration of the column ADCs and the registers in the solid-state image sensing device 10 according to the second embodiment of the invention. The column ADCs 12 and the registers 17 shown in FIG. 14 are divided into groups of k pixel columns (k is a natural number equal to or greater than 1), and provided with logic circuits 22 to 25 for generating control signals for controlling timings of transfer of converted image digital signals from the column ADCs 12 to the registers 17 for the respective divided groups. The logic circuits 22 to 25 function as control signal generation units for generating control signals for controlling timings of transfer to the registers 17 from the column ADCs 12 operating in parallel. The solid-state image sensing device 10 according to the second embodiment of the invention has the same configuration as the solid-state image sensing device 10 according to the first embodiment except for the configuration of the logic circuits 22 to 25; therefore, the same components are denoted by the same reference numerals, and detailed description thereof is omitted. Although the converted image digital signal is transferred from the latch circuit 123 in the column ADC 12 to the register 17 as described in the first embodiment, the following description is based on transfer from the column ADC 12 to the register 17 for simplicity.

The logic circuit 22 is an AND circuit, and generates a control signal having the H level by performing a logic operation when the inputted transfer signal TRF and selection signals SEL<1> and SEL<0> are all at the H level. The logic circuit 23 is an AND circuit to which the level of the selection signal SEL<0> is inversely inputted, and generates a control signal having the H level by performing a logic operation when the inputted transfer signal TRF and selection signal SEL<1> are both at the H level and the selection signal SEL<0> is at the L level. The logic circuit 24 is an AND circuit to which the level of the selection signal SEL<1> is inversely inputted, and generates a control signal having the H level by performing a logic operation when the inputted transfer signal TRF and selection signal SEL<0> are both at the H level and the selection signal SEL<1> is at the L level. The logic circuit 25 is an AND circuit to which the levels of the selection signals SEL<0> and SEL<1> are inversely inputted, and generates a control signal having the H level by performing a logic operation when the inputted transfer signal TRF is at the H level and the selection signals SEL<0> and SEL<1> are both at the L level.

That is, based on the 2-bit selection signal SEL, the solid-state image sensing device 10 according to the second embodiment switches among the logic circuits 22 to 25 for generating the control signals having the H level. Therefore, the timing when the control signal generated by the logic circuit 22 becomes the H level differs from the timing when the control signal generated by the logic circuit 23 becomes the H level, and the transfer timings of image digital signals differ between the groups provided with the logic circuits 24 and 25 respectively.

Figure 15:
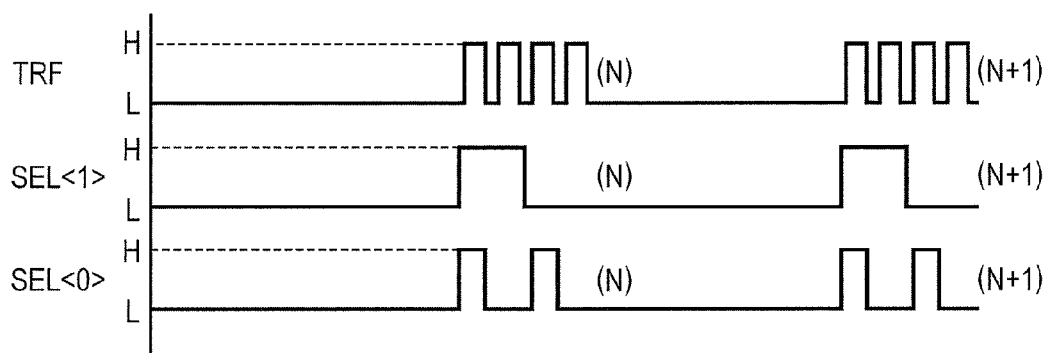
FIG. 15 is a timing chart of assistance in explaining the operation of the solid-state image sensing device according to the second embodiment of the invention.

FIG. 15 is a timing chart of assistance in explaining the operation of the solid-state image sensing device 10 according to the second embodiment of the invention. The timing chart of FIG. 15 illustrates signal waveforms of the transfer signal TRF, the selection signal SEL<0>, and the selection signal SEL<1> in the readout of image digital signals from pixels in the Nth and (N+1)th rows. The signal waveforms of the row selection signal SL, the reset control signal RX, the transfer control signal TX, the state of the column ADC 12, and the clock signal HSCAN are the same as those shown in FIG. 13; therefore, their illustration and description are omitted.

As shown in FIG. 15, in a period when the selection signals SEL<0> and SEL<1> are at the H level, on the rising edge of the transfer signal TRF from the L level to the H level, the control signal generated by the logic circuit 22 becomes the H level, so that in the group provided with the logic circuit 22, the converted image digital signal is transferred from the column ADC 12 to the register 17. In a period when the selection signal SEL<0> is at the L level and the selection signal SEL<1> is at the H level, on the rising edge of the transfer signal TRF from the L level to the H level, the control signal generated by the logic circuit 23 becomes the H level, so that in the group provided with the logic circuit 23, the converted image digital signal is transferred from the column ADC 12 to the register 17. In a period when the selection signal SEL<0> is at the H level and the selection signal SEL<1> is at the L level, on the rising edge of the transfer signal TRF from the L level to the H level, the control signal generated by the logic circuit 24 becomes the H level, so that in the group provided with the logic circuit 24, the converted image digital signal is transferred from the column ADC 12 to the register 17. Further, in a period when the selection signals SEL<0> and SEL<1> are at the L level, on the rising edge of the transfer signal TRF from the L level to the H level, the control signal generated by the logic circuit 25 becomes the H level, so that in the group provided with the logic circuit 25, the converted image digital signal is transferred from the column ADC 12 to the register 17.

Thus, since the timings of transfer of image digital signals in the Nth row from the column ADCs 12 to the registers 17 differ among the groups provided with the logic circuits 22 to 25 respectively, the image digital signals of 3000 pixels can be transferred from the column ADCs 12 to the registers 17 at four different timings. Accordingly, in comparison with transfer of the image digital signals of 3000 pixels from the column ADCs 12 to the registers 17 at the same timing, the solid-state image sensing device 10 can reduce to a quarter an instantaneous current occurring in transfer and thereby reduce noise sneaking into the column ADCs 12 and the pixel array 11.

The logic circuits 22 to 25 shown in FIG. 14 are shared by the column ADCs 12 in k columns respectively to reduce the instantaneous current occurring in the logic circuits and reduce the occupation area. The logic circuits 22 to 25 are not limited to the configuration shown in FIG. 14, and may have a NAND circuit to invert the selection signal SEL.

As described above, since the control signals of different transfer timings are generated for the groups provided with the logic circuits 22 to 25 respectively, the solid-state image sensing device 10 according to the second embodiment of the invention can reduce processing for transferring the image digital signals from the column ADCs 12 to the registers 17 at the same timing and thereby reduce the instantaneous current occurring in transfer to reduce the noise sneaking into the column ADCs 12 and the pixel array 11.

The selection signal SEL is not limited to 2 bits, and may be n bits (n is a natural number equal to or greater than 3). In the case of n bits, although n kinds of logic circuits are needed, the number of pixels of the image digital signals transferred from the column ADCs 12 to the registers 17 at the same timing can be reduced to $1/(2^n)$, which can reduce to $1/(2^n)$ an instantaneous current occurring in transfer and thereby reduce noise sneaking into the column ADCs 12 and the pixel array 11.

Third Embodiment

The solid-state image sensing device 10 according to the first and second embodiments switches among the circuits for generating the control signals having the H level and different transfer timings, using the selection signal SEL. In a third embodiment, a solid-state image sensing device for generating control signals of different transfer timings for respective groups by delaying the transfer signal TRF for starting processing for transferring the converted image digital signal from the column ADC 12 to the register 17 without using the selection signal SEL will be described.

Figure 16:
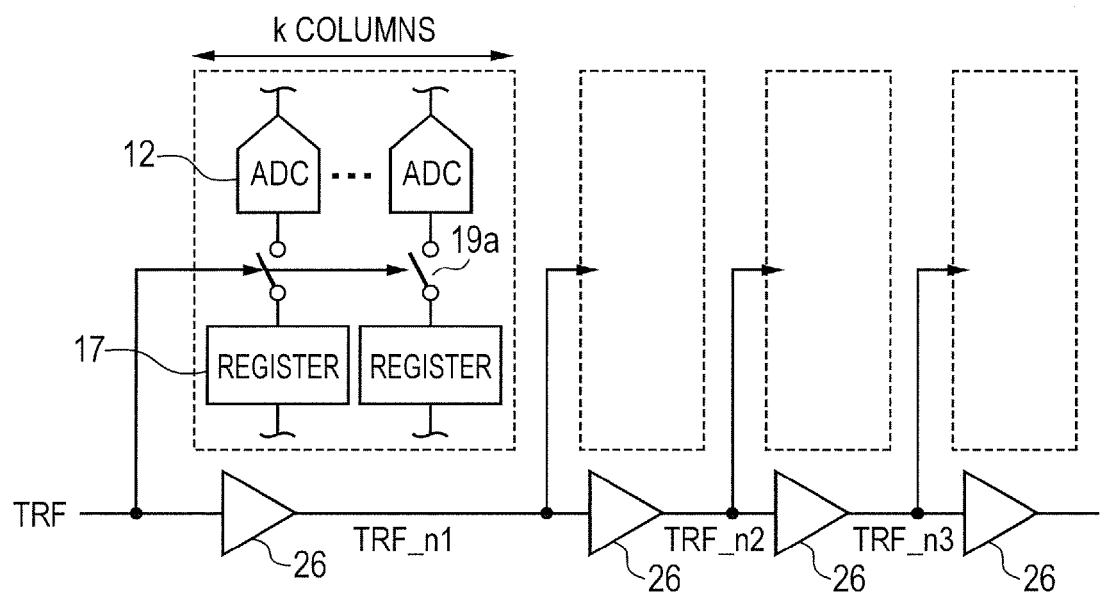
FIG. 16 is a schematic diagram showing the configuration of the column ADCs and the registers in a solid-state image sensing device according to a third embodiment of the invention.

FIG. 16 is a schematic diagram showing the configuration of the column ADCs and the registers in the solid-state image sensing device 10 according to the third embodiment of the invention. The column ADCs 12 and the registers 17 shown in FIG. 14 are divided into groups of k pixel columns (k is a natural number equal to or greater than 1), and provided with delay circuits 26 for delaying transfer signals TRF for the respective divided groups. The delay circuits 26 are coupled in series, in which a transfer signal (e.g., TRF_n1) that has been delayed by a preceding delay circuit 26 is further delayed by a subsequent delay circuit 26 to generate a transfer signal (control signal) (e.g., TRF_n2). The delay circuits 26 function as control signal generation units for generating control signals for controlling timings of transfer to the registers 17 from the column ADCs 12 operating in parallel. Further, in the solid-state image sensing device 10 according to the third embodiment, the transfer signal TRF and the transfer signals (e.g., TRF_n1) that have been delayed by the delay circuits 26 are directly inputted to the switching elements 19a, and function as control signals for controlling timings of transfer of the converted image digital signals from the column ADCs 12 to the registers 17.

The solid-state image sensing device 10 according to the third embodiment of the invention has the same configuration as the solid-state image sensing device 10 according to the first embodiment except for the configuration with the delay circuits 26 in place of the logic circuits 20 and 21; therefore, the same components are denoted by the same reference numerals, and detailed description thereof is omitted. Although the converted image digital signal is transferred from the latch circuit 123 in the column ADC 12 to the register 17 as described in the first embodiment, the following description is based on transfer from the column ADC 12 to the register 17 for simplicity.

The delay circuit 26 may be of any circuit configuration as long as it can delay the transfer signal TRF. For example, by configuring the delay circuit 26 with a CMOS inverter circuit, the delay circuit 26 can be formed in the same process as other circuits, which can decrease the manufacturing cost.

In the solid-state image sensing device 10 according to the third embodiment, the series-coupled delay circuits 26 delay the transfer signals TRF in sequence to generate the transfer signals TRF_n1, TRF_n2, TRF_n3, TRF_n4, . . . , thus making different timings of transfer of the converted image digital signals from the column ADCs 12 to the registers 17.

Figure 17:
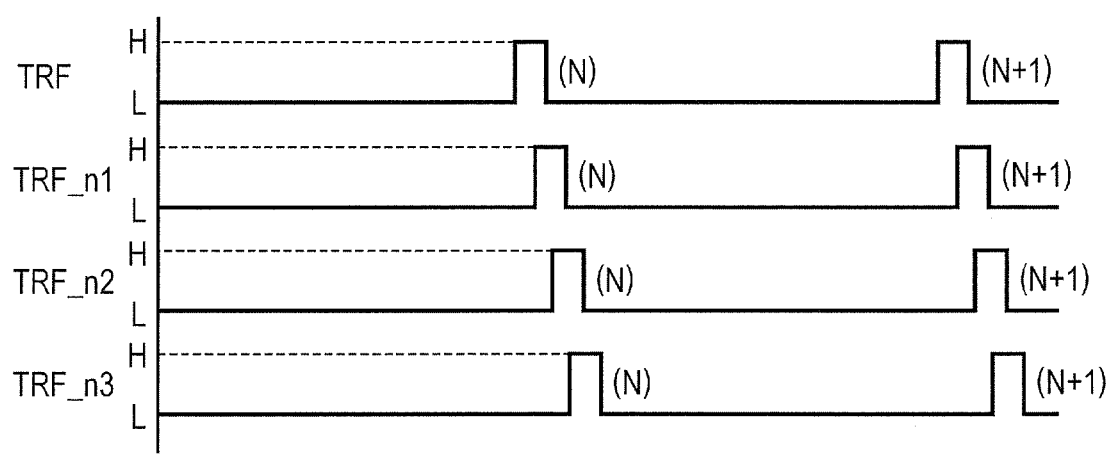
FIG. 17 is a timing chart of assistance in explaining the operation of the solid-state image sensing device according to the third embodiment of the invention.

FIG. 17 is a timing chart of assistance in explaining the operation of the solid-state image sensing device 10 according to the third embodiment of the invention. The timing chart of FIG. 17 illustrates signal waveforms of the transfer signal TRF and the delayed transfer signals TRF_n1 to TRF_n3 in the readout of image digital signals from pixels in the Nth and (N+1)th rows. The signal waveforms of the row selection signal SL, the reset control signal RX, the transfer control signal TX, the state of the column ADC 12, and the clock signal HSCAN are the same as those shown in FIG. 13; therefore, their illustration and description are omitted.

As shown in FIG. 17, the delay circuit 26 that receives the transfer signal TRF outputs the rising edge from the L level to the H level of the transfer signal TRF_n1 delayed with respect to the transfer signal TRF. The delay circuit 26 that receives the transfer signal TRF_n1 outputs the rising edge from the L level to the H level of the transfer signal TRF_n2 delayed with respect to the transfer signal TRF_n1. The delay circuit 26 that receives the transfer signal TRF_n2 outputs the rising edge from the L level to the H level of the transfer signal TRF_n3 delayed with respect to the transfer signal TRF_n2.

Thus, since the delay circuits 26 delay the rising edges from the L level to the H level of the transfer signals TRF and TRF_n1 to TRF_n3 in groups of k pixel columns, the timings of transfer of image digital signals in the Nth row from the column ADCs 12 to the registers 17 differ among the groups of k pixel columns. Therefore, the pixels in 3000 columns are divided into the groups of k pixel columns, and can be transferred from the column ADCs 12 to the registers 17 at (3000/k) different timings. Accordingly, in comparison with transfer of the image digital signals of 3000 pixels from the column ADCs 12 to the registers 17 at the same timing, the solid-state image sensing device 10 can reduce to k/3000 (the number of pixels in the horizontal direction) an instantaneous current occurring in transfer and thereby reduce noise sneaking into the column ADCs 12 and the pixel array 11.

As described above, since the delay circuits 26 are coupled in series, in which the transfer signal TRF that has been delayed by the preceding delay circuit 26 is further delayed by the subsequent delay circuit 26, to generate control signals (delayed transfer signals TRF) of different transfer timings for the respective groups, the solid-state image sensing device 10 according to the third embodiment of the invention can reduce processing for transferring the image digital signals from the column ADCs 12 to the registers 17 at the same timing and thereby reduce the instantaneous current occurring in transfer to reduce the noise sneaking into the column ADCs 12 and the pixel array 11.

The delay circuits 26 do not need to be provided for the respective groups of k pixel columns, and may be provided for respective units including at least one group.

Fourth Embodiment

A solid-state image sensing device according to a fourth embodiment obtained by combining the first embodiment and the third embodiment will be described.

Figure 18:
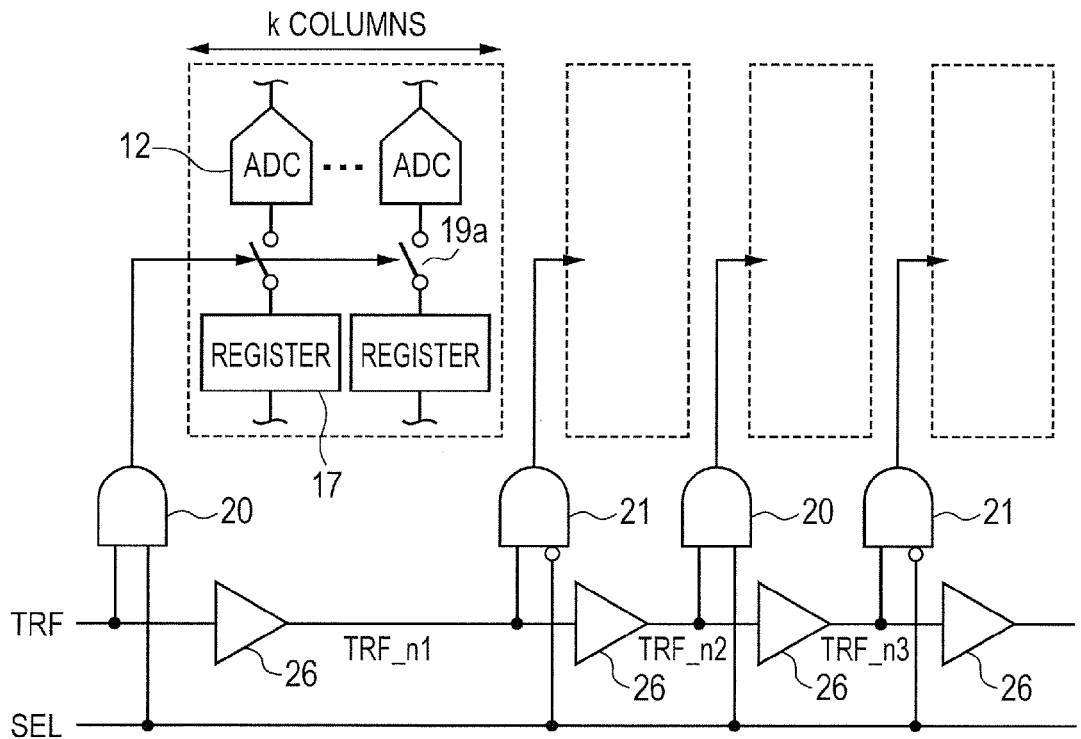
FIG. 18 is a schematic diagram showing the configuration of the column ADCs and the registers in a solid-state image sensing device according to a fourth embodiment of the invention.

FIG. 18 is a schematic diagram showing the configuration of the column ADCs and the registers in the solid-state image sensing device 10 according to the fourth embodiment of the invention. The column ADCs 12 and the registers 17 shown in FIG. 18 are divided into groups of k pixel columns (k is a natural number equal to or greater than 1), and provided with the logic circuits 20 and 21 for generating control signals for controlling timings of transfer of converted image digital signals from the column ADCs 12 to the registers 17 for the respective divided groups. Further, the column ADCs 12 and the registers 17 are provided with the delay circuits 26 for delaying the transfer signals TRF for the respective divided groups.

The solid-state image sensing device 10 according to the fourth embodiment of the invention has the configuration obtained by combining the configuration of the column ADCs 12 and the registers 17 shown in FIG. 12 and the configuration of the column ADCs 12 and the registers 17 shown in FIG. 16; therefore, the same components are denoted by the same reference numerals, and detailed description thereof is omitted. Although the converted image digital signal is transferred from the latch circuit 123 in the column ADC 12 to the register 17 as described in the first embodiment, the following description is based on transfer from the column ADC 12 to the register 17 for simplicity.

The solid-state image sensing device 10 according to the fourth embodiment of the invention switches between the logic circuits 20 and 21 for generating the control signals having the H level, using the 1-bit selection signal SEL. Further, the series-coupled delay circuits 26 delay the transfer signals TRF in sequence to generate the transfer signals TRF_n1, TRF_n2, TRF_n3, TRF_n4, . . . . Therefore, the timing when the control signal generated by the logic circuit 20 becomes the H level differs from the timing when the control signal generated by the logic circuit 21 becomes the H level, and the delay circuits 26 delay the rising edges from the L level to the H level of the transfer signals TRF for the respective groups. Accordingly, the solid-state image sensing device 10 according to the fourth embodiment of the invention can make different transfer timings of image digital signals between the groups provided with the logic circuits 20 and 21 respectively, and can also make different transfer timings of image digital signals among the groups provided with the logic circuit 20 and among the groups provided with the logic circuit 21.

It is necessary to increase a delay time Δt for delaying the transfer signals TRF to obtain a desired result only by providing the delay circuits 26 as in the solid-state image sensing device 10 according to the third embodiment. However, it is necessary to increase a circuit area to increase the delay time Δt of the delay circuits 26 configured with CMOS inverter circuits. Therefore, by combining the first embodiment and the third embodiment, the solid-state image sensing device 10 according to the fourth embodiment of the invention switches between the control signals for the groups provided with the logic circuits 20 and 21 respectively to halve the delay time Δt of the delay circuits 26 provided for the respective groups. Accordingly, the solid-state image sensing device 10 according to the fourth embodiment of the invention can obtain the desired result while preventing the circuit area of the delay circuits 26 from increasing.

As described above, since the solid-state image sensing device 10 according to the fourth embodiment of the invention has the delay circuits 26 for delaying the transfer signals TRF and the logic circuits 20 and 21 for generating the control signals by performing logic operations on the transfer signals TRF and the selection signal SEL for selecting among the groups, the solid-state image sensing device 10 can reduce the instantaneous current occurring in transfer to reduce the noise sneaking into the column ADCs 12 and the pixel array 11 while preventing the circuit area of the delay circuits 26 from increasing.

Fifth Embodiment

In a fifth embodiment, a solid-state image sensing device for making different timings of transfer of the image digital signal from the column ADC 12 to the register 17 for respective bits by generating transfer signals TRF of different timings of the H level for the respective bits will be described.

Figure 19:
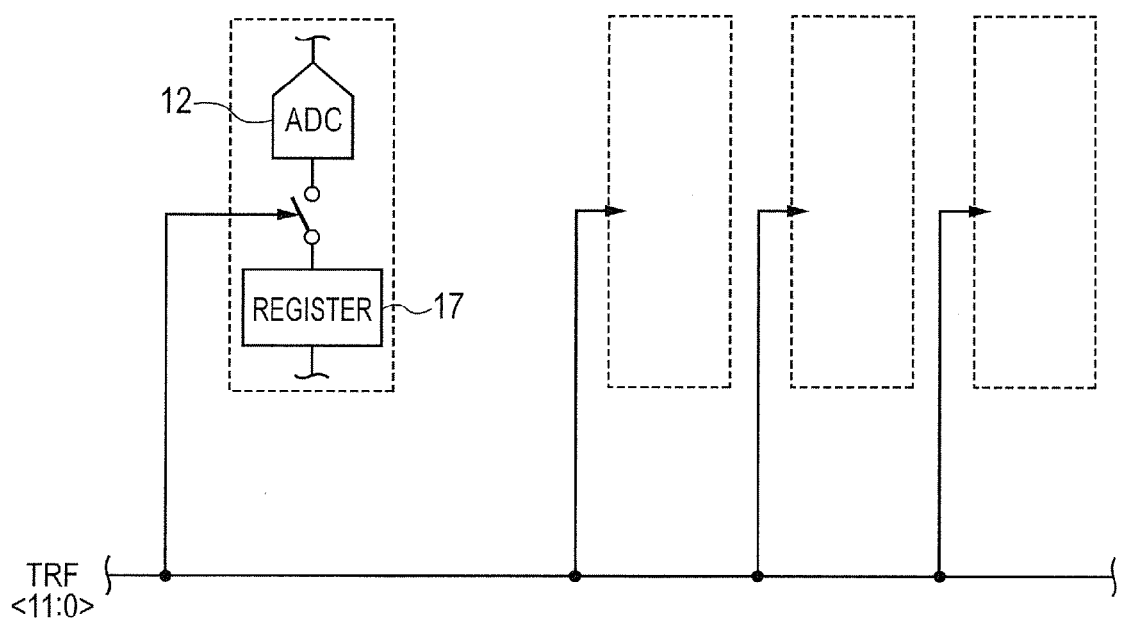
FIG. 19 is a schematic diagram showing the configuration of the column ADCs and the registers in a solid-state image sensing device according to a fifth embodiment of the invention.

FIG. 19 is a schematic diagram showing the configuration of the column ADCs and the registers in the solid-state image sensing device 10 according to the fifth embodiment of the invention. As for the column ADCs 12 and the registers 17 shown in FIG. 19, a transfer signal TRF<11:0> of different timings of the H level for the respective bits is supplied. Therefore, the solid-state image sensing device 10 can control the timings of transfer of converted image digital signals from the column ADCs 12 to the registers 17 for the respective bits.

For example, in a period when a transfer signal TRF<0> is at the H level, image digital signals of the least significant bits of column ADCs 12 that have finished conversion into image digital signals are transferred to registers 17. In the same way, in a period when a transfer signal TRF<1> is at the H level, image digital signals of the second least significant bits of column ADCs 12 that have finished conversion into image digital signals are transferred to registers 17. Further, in a period when a transfer signal TRF<11> is at the H level, image digital signals of the most significant bits of column ADCs 12 that have finished conversion into image digital signals are transferred to registers 17.

The solid-state image sensing device 10 according to the fifth embodiment of the invention has the same configuration as the solid-state image sensing device 10 according to the first embodiment except for the configuration without the logic circuits 20 and 21; therefore, the same components are denoted by the same reference numerals, and detailed description thereof is omitted. Although the converted image digital signal is transferred from the latch circuit 123 in the column ADC 12 to the register 17 as described in the first embodiment, the following description is based on transfer from the column ADC 12 to the register 17 for simplicity.

Figure 20:
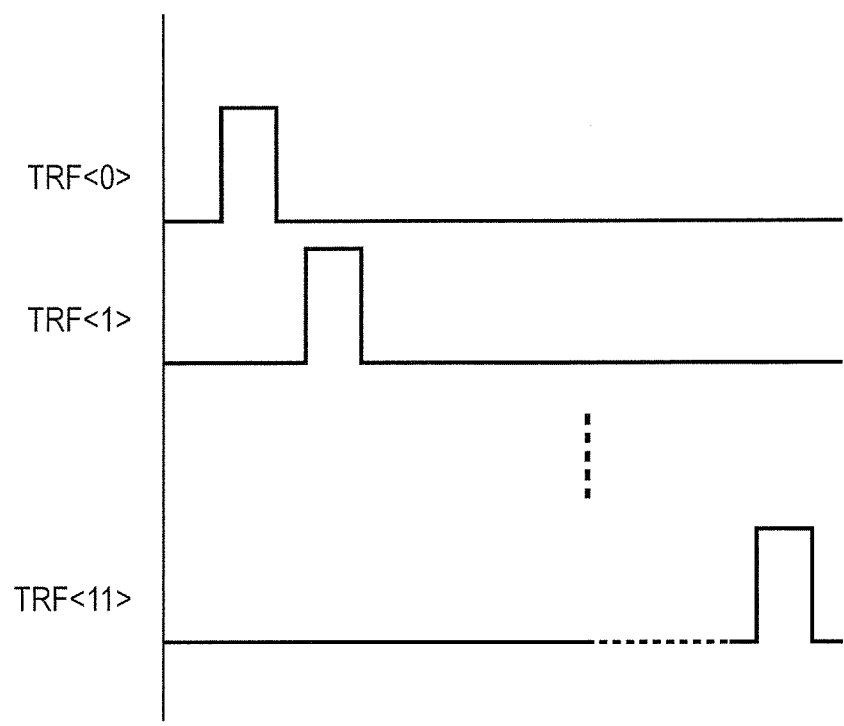
FIG. 20 is a timing chart of assistance in explaining the operation of the solid-state image sensing device according to the fifth embodiment of the invention.

FIG. 20 is a timing chart of assistance in explaining the operation of the solid-state image sensing device 10 according to the fifth embodiment of the invention. The timing chart of FIG. 20 illustrates signal waveforms of the transfer signals TRF<0> to TRF<11>. The signal waveforms of the row selection signal SL, the reset control signal RX, the transfer control signal TX, the state of the column ADC 12, and the clock signal HSCAN are the same as those shown in FIG. 13; therefore, their illustration and description are omitted.

As shown in FIG. 20, the transfer signals TRF<0> to TRF<11> have different timings of the H level for the respective bits. Accordingly, in the period when the transfer signal TRF<0> is at the H level, the solid-state image sensing device 10 can transfer image digital signals from column ADCs 12 to registers 17 only in groups that have finished conversion into image digital signals. Assume that column ADCs 12 in one row finish conversion into image digital signals within the period of the H level of the transfer signals TRF<0> to TRF<11>.

As described above, since the solid-state image sensing device 10 according to the fifth embodiment of the invention generates the control signals of different timings of the transfer signals TRF for starting processing for transferring the converted image digital signals from the column ADCs 12 to the registers 17 for the respective bits, the solid-state image sensing device 10 can reduce processing for transferring the image digital signals from the column ADCs 12 to the registers 17 at the same timing and thereby reduce the instantaneous current occurring in transfer to reduce the noise sneaking into the column ADCs 12 and the pixel array 11.

The disclosed embodiments are to be considered in all respects as illustrative and not restrictive. The scope of the invention is indicated by the appended claims rather than by the foregoing description, and all changes which come within the meaning and range of equivalency of the claims are therefore intended to be embraced therein.

What is claimed is:

1. A solid-state image sensing device comprising:
a pixel array having a plurality of imaging elements arranged in a matrix;
a row selection circuit for selecting a row in the pixel array;
a plurality of analog-digital converters which are disposed in respective columns in the pixel array and convert image analog signals read out from imaging elements selected by the row selection circuit into image digital signals;
a plurality of signal holding circuits for holding the image digital signals converted by the analog-digital converters in respective columns in the pixel array; and
control signal generation units for generating control signals for controlling timings of transfer of the converted image digital signals from the analog-digital converters to the signal holding circuits,
wherein the control signal generation units are provided for respective groups into which the analog-digital converters and the signal holding circuits disposed on one side of the pixel array are divided, and generate the control signals of different timings, for respective units including at least one group, of transfer of the converted image digital signals to the signal holding circuits from the analog-digital converters operating in parallel,
wherein the solid-state image sensing device switches among the control signal generation units for generating the control signals for the respective units including at least one group, and the control signal generation units generate the control signals of different transfer timings for the respective units including at least one group, and
wherein the control signal generation units include first to fourth logic circuits for generating the control signals by performing logic operations on a transfer signal for starting processing for transferring the converted image digital signals from the analog-digital converters to the signal holding circuits and first and second selection signals for selecting among the groups, and based on the selection signals, the solid-state image sensing device switches among the first to fourth logic circuits for generating the control signals of different transfer timings among the groups provided with the first to fourth logic circuits respectively.

2. A solid-state image sensing device comprising:
a pixel array having a plurality of imaging elements arranged in a matrix;
a row selection circuit for selecting a row in the pixel array;
a plurality of analog-digital converters which are disposed in respective columns in the pixel array and convert image analog signals read out from imaging elements selected by the row selection circuit into image digital signals;
a plurality of signal holding circuits for holding the image digital signals converted by the analog-digital converters in respective columns in the pixel array; and
control signal generation units for generating control signals for controlling timings of transfer of the converted image digital signals from the analog-digital converters to the signal holding circuits,
wherein the control signal generation units are provided for respective groups into which the analog-digital converters and the signal holding circuits disposed on one side of the pixel array are divided, and generate the control signals of different timings, for respective units including at least one group, of transfer of the converted image digital signals to the signal holding circuits from the analog-digital converters operating in parallel,
wherein the control signal generation units delay transfer signals for starting processing for transferring the converted image digital signals from the analog-digital converters to the signal holding circuits for the respective units including at least one group to generate the control signals of different transfer timings for the respective units including at least one group,
wherein the control signal generation units include a plurality of delay circuits for delaying the transfer signals to generate the control signals, and
wherein the delay circuits are coupled in series, in which a transfer signal that has been delayed by a preceding delay circuit is further delayed by a subsequent delay circuit to generate the control signals of different transfer timings for the respective units including at least one group.

3. A solid-state image sensing device comprising
a pixel array having a plurality of imaging elements arranged in a matrix;
a row selection circuit for selecting a row in the pixel array;
a plurality of analog-digital converters which are disposed in respective columns in the pixel array and convert image analog signals read out from imaging elements selected by the row selection circuit into image digital signals;

a plurality of signal holding circuits for holding the image digital signals converted by the analog-digital converters in respective columns in the pixel array; and control signal generation units for generating control signals for controlling timings of transfer of the converted image digital signals from the analog-digital converters to the signal holding circuits, wherein the control signal generation units are provided for respective groups into which the analog-digital converters and the signal holding circuits disposed on one side of the pixel array are divided, and generate the control signals of different timings, for respective units including at least one group, of transfer of the converted image digital signals to the signal holding circuits from the analog-digital converters operating in parallel, wherein the solid-state image sensing device switches among the control signal generation units for generating the control signals for the respective units including at least one group, and the control signal generation units generate the control signals of different transfer timings for the respective units including at least one group, wherein the control signal generation units include a plurality of delay circuits for delaying transfer signals for starting processing for transferring the converted image digital signals from the analog-digital converters to the signal holding circuits and first and second logic circuits for generating the control signals by performing logic operations on the transfer signals and a selection signal for selecting among the groups, wherein the delay circuits provided corresponding to the respective groups are coupled in series, in which a transfer signal that has been delayed by a preceding delay circuit is further delayed by a subsequent delay circuit, and wherein based on the selection signal, the solid-state image sensing device switches between the first and second logic circuits for generating the control signals to generate the control signals of different transfer timings among the groups respectively.

4. The solid-state image sensing device according to claim 2, wherein the delay circuits are CMOS inverter circuits.

* * * * *